United States Patent [19]
Nogami

[11] Patent Number: 4,973,864
[45] Date of Patent: Nov. 27, 1990

[54] SENSE CIRCUIT FOR USE IN SEMICONDUCTOR MEMORY
[75] Inventor: Kazutaka Nogami, Tokyo, Japan
[73] Assignee: Kabushiki Kaisha Toshiba, Kawasaki, Japan
[21] Appl. No.: 379,373
[22] Filed: Jul. 11, 1989
[30] Foreign Application Priority Data Jul. 13, 1988 [JP] Japan .................. 63-174419

[51] Int. Cl.$^5$ ............ H03K 17/04; H03K 3/356; H03K 19/01; G11C 7/00
[52] U.S. Cl. ............................. 307/530; 307/279; 365/205; 365/189.05
[58] Field of Search .............. 307/530, 279, 475, 355, 307/269, 603; 365/203, 205, 154, 104, 196, 189.05

[56] References Cited
U.S. PATENT DOCUMENTS

| 4,494,020 | 1/1985 | Konishi | 307/530 |
| 4,606,012 | 8/1986 | Koshizuka | 307/530 |
| 4,616,148 | 10/1986 | Ochii et al. | 307/530 |
| 4,816,706 | 3/1989 | Dhong et al. | 307/530 |
| 4,831,287 | 5/1989 | Golab | 307/530 |
| 4,843,264 | 6/1989 | Galbraith | 307/530 |
| 4,845,675 | 7/1989 | Krenik et al. | 307/530 X |
| 4,871,978 | 10/1989 | Galbraith | 307/530 X |
| 4,894,559 | 1/1990 | Kaneko | 307/530 |

OTHER PUBLICATIONS
Zairyo, Denshi, Cache Unit; Y. Tanaka, pp. 146–153, Jun. 1987.
Matsui, M. et al., A 25-ns 1-Mbit CMOS SRAM with Loading-Free Bit Lines, IEEE Journal of Solid-State Circuits, vol. SC-22, No. 5, Oct. 1987.

Primary Examiner—Stanley D. Miller
Assistant Examiner—David R. Bertelson
Attorney, Agent, or Firm—Finnegan, Henderson, Farabow, Garrett, and Dunner

[57] ABSTRACT

A sense circuit includes first and second input nodes, first and second output nodes, first to fifth MOSFETs of N-channel type, and first and second potential setting circuits, and the first and second output nodes are precharged to a power source potential by the first and second potential setting circuits before the sensing operation is started. After this, the first MOSFET is turned on by a control signal to start the sensing operation. After the sensing operation is started, the potentials of the first and second input nodes are respectively amplified by the second and third MOSFETs and the fourth and fifth MOSFETs and the amplified potentials are derived from the first and second output nodes.

19 Claims, 11 Drawing Sheets

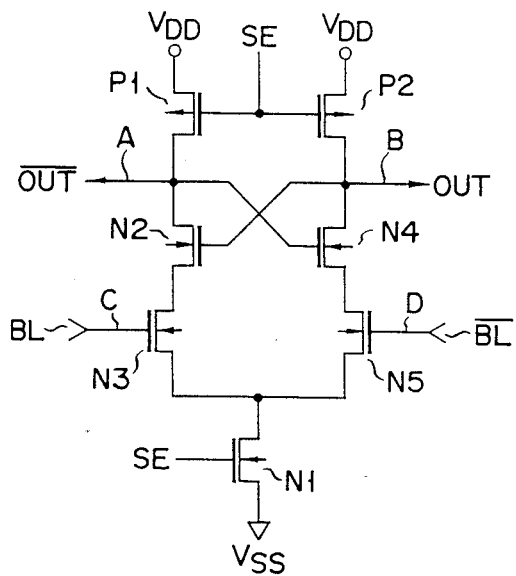
F I G. 3
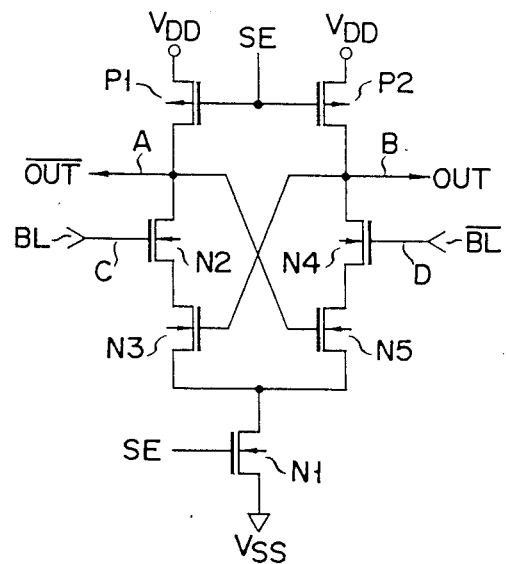
F I G. 4

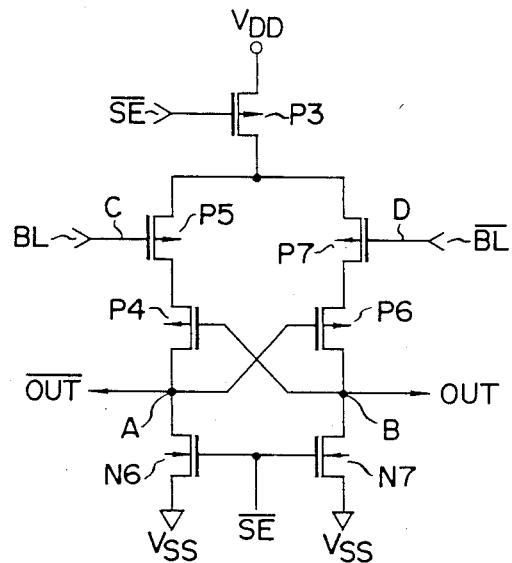
F I G. 5
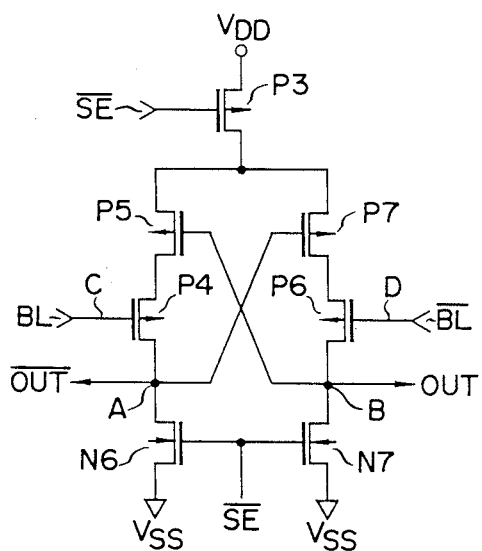
F I G. 6

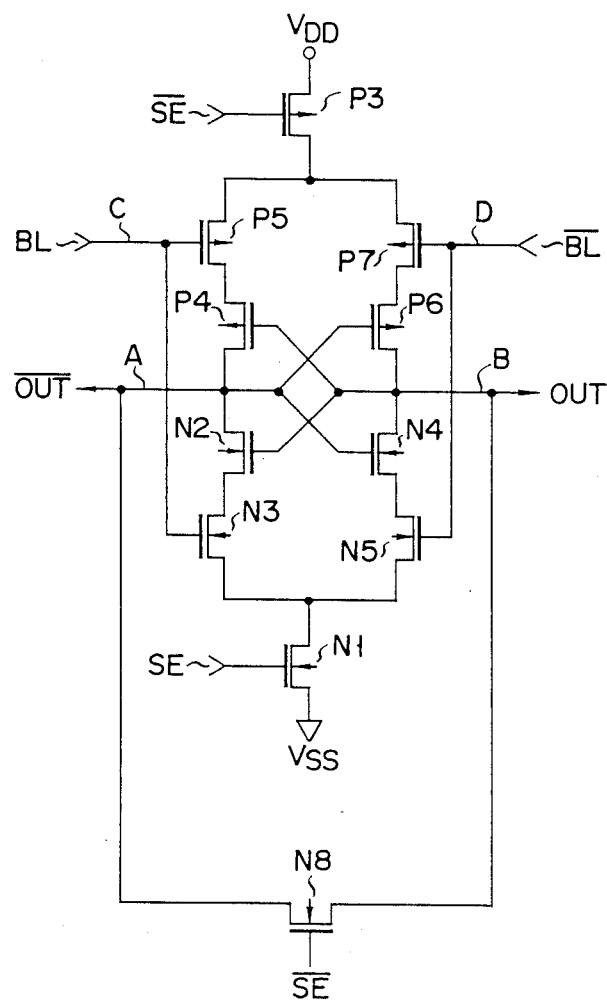
F I G. 7

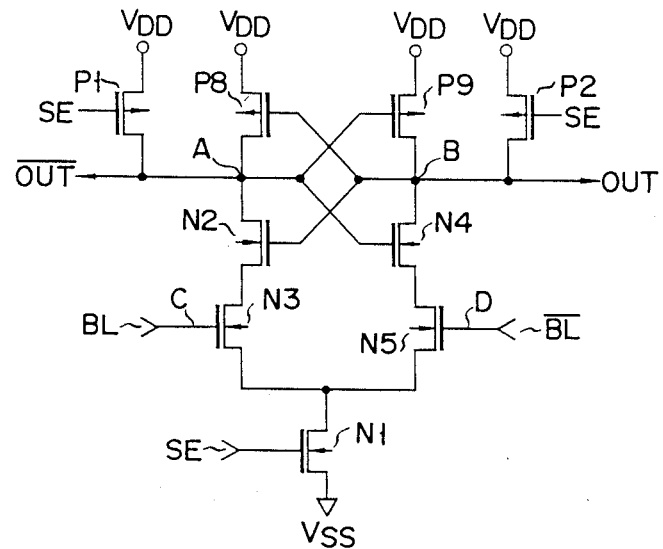
F I G. 11
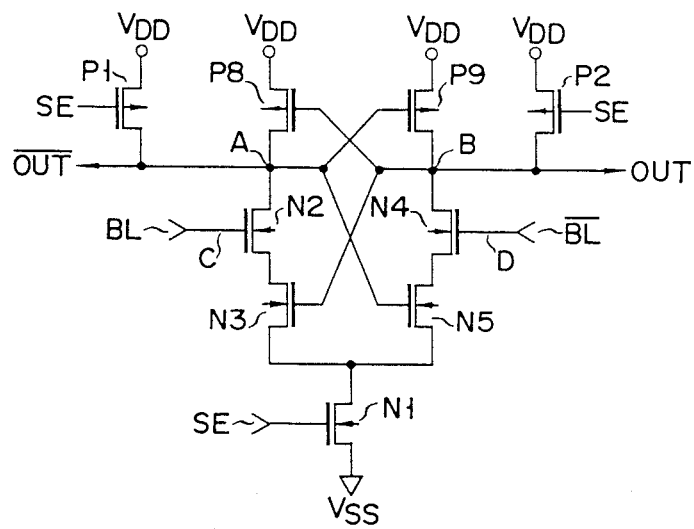
F I G. 12

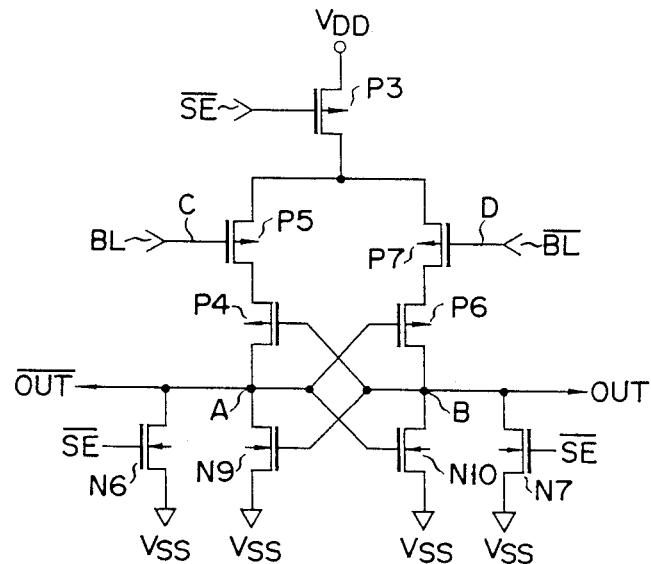
F I G. 13
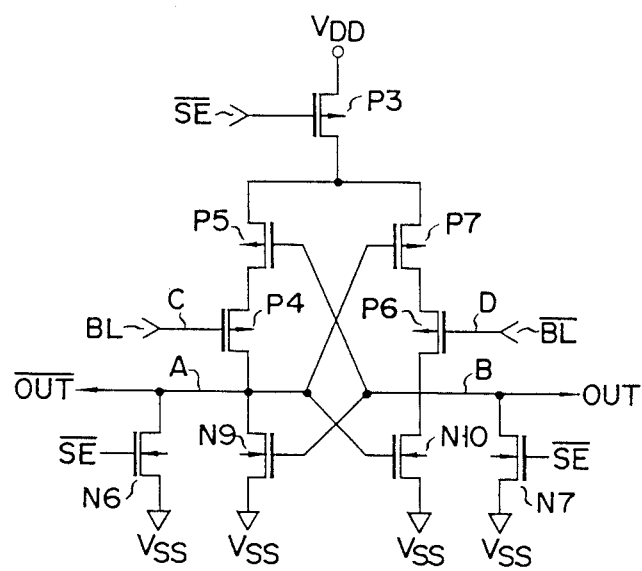
F I G. 14

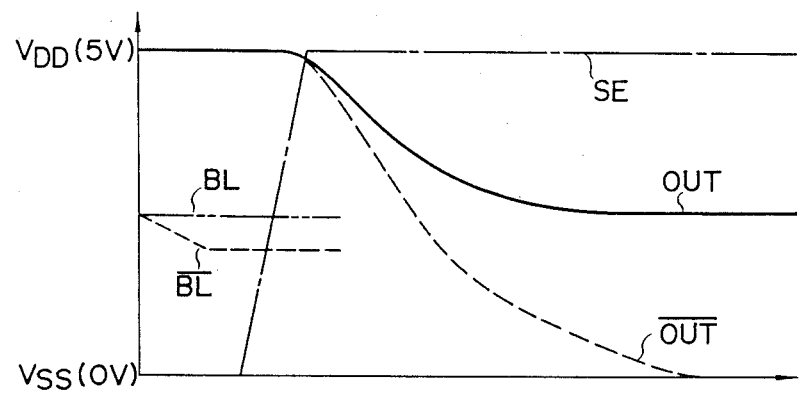
F I G. 15
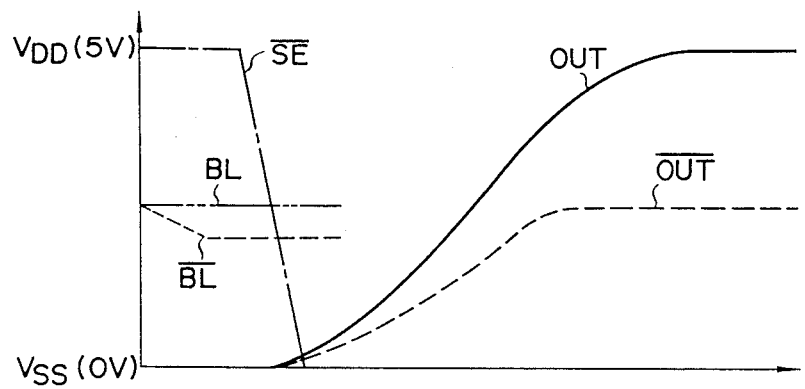
F I G. 16
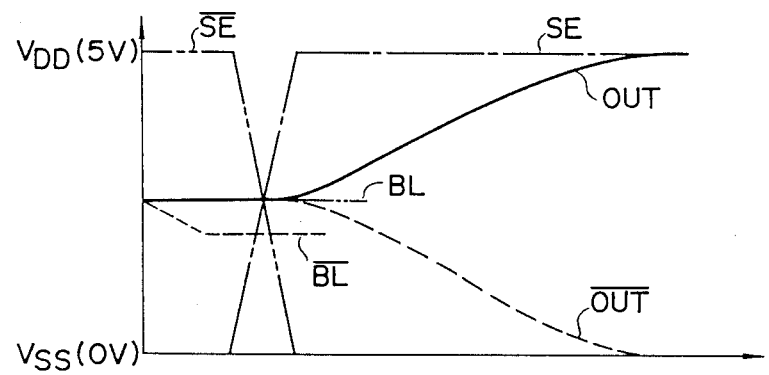
F I G. 17

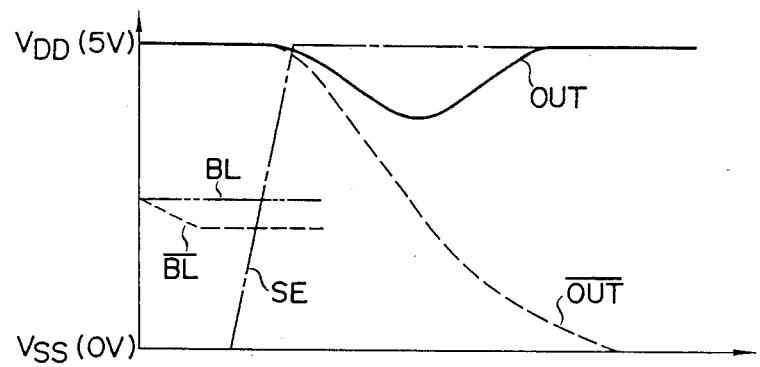
F I G. 18
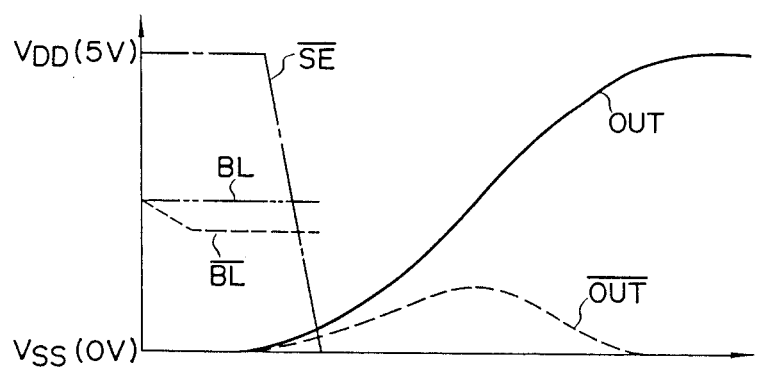
F I G. 19

SENSE CIRCUIT FOR USE IN SEMICONDUCTOR MEMORY

BACKGROUND OF THE INVENTION

1. Field of the Invention

This invention relates to a sense circuit for use in a semiconductor memory of multi-bit configuration or the like, and more particularly to a sense circuit constituted by use of MOSFETs.

2. Description of the Related Art

Conventionally, a latch sense circuit of the construction shown in FIG. 1 and current mirror type sense circuit of the construction shown in FIG. 2 are known in the art as a sense circuit for use in a semiconductor memory.

The latch sense circuit shown in FIG. 1 includes two CMOS inverters I1 and I2 whose input terminals are connected to a pair of bit lines BL and $\overline{BL}$. The input and output terminals of COMS inverter I1 are respectively connected to the output and input terminals of CMOS inverter I2. The sense circuit is activated when sense circuit activation signal SE is set at "H" level and inverted signal $\overline{SE}$ of the sense circuit activation signal is set at "L" level, and at this time the difference in potential between paired bit lines BL and $\overline{BL}$ is amplified by the sense circuit.

The latch sense circuit should not be activated until the difference in potential between paired bit lines BL and $\overline{BL}$ becomes sufficiently large. Otherwise, data may be erroneously read out. In order to prevent the erroneous readout operation, it is necessary to take a sufficiently long time before the activation, thereby lowering the sense speed.

When the latch sense circuit finished the sensing operation, bit lines BL and $\overline{BL}$ are set at the power source potential or the ground potential and thus the potential amplitude of the bit line potential becomes large. If the parasitic capacitance associated with the bit line is large or the cycle time is short, the power consumption caused by charging the bit line becomes large.

The current mirror type sense circuit shown in FIG. 2 includes two input N-channel MOSFETs N21 and N22, current limiting N-channel MOSFET N23 and two P-channel MOSFETs P21 and P22 used as the current mirror load.

In the current mirror type sense circuit, the input terminals thereof are connected to a pair of bit lines BL and $\overline{BL}$. When sense circuit activation signal SE is set at "H" level, current limiting MOSFET N23 is turned on and the current mirror type sense circuit is activated to derive data corresponding to the difference in potential between the paired bit lines at output node DO. In this case, the amplification of the input signal is not effected, that is, the input potential is not changed over a full variation range of the power source voltage. As a result, the power consumption caused by charging and discharging the bit line can be suppressed to a minimum.

However, since the sense speed of the current mirror type sense circuit can be determined by current flowing in current limiting MOSFET N23, it is necessary to supply current of more than 0.3 mA, for example, in each sense circuit in order to sense the potential difference of the bit lines at a high speed. Therefore, in order to effect the simultaneous readout operation for a semiconductor memory of 200 bits, for example, a power of 0.3 W is dissipated only in the sense circuit if power source voltage VDD is 5 V. Therefore, the number of bits which can be simultaneously read is limited because the power consumption is limited. That is, in a semiconductor memory in which a large number of bits, for example, 500 bits are simultaneously read out, the above current mirror type sense circuit cannot be used.

Summary of the Invention

An object of this invention is to provide a sense circuit which can simultaneously read out a relatively large number of bits of a semiconductor memory with low power consumption.

According to one aspect of this invention, a sense circuit is provided which comprises first and second input nodes; first and second output nodes; a first MOSFET of a first conductivity type having a drain, a source connected to a first potential terminal and a gate connected to receive a control signal; second and third MOSFETs of the first conductivity type each having a source, a drain and a gate, the gates of the second and third MOSFETs being respectively connected to the second output node and the first input node, and the source-drain paths of the second and third MOSFETs being serially connected between the first output node and the drain of the first MOSFET; fourth and fifth MOSFETs of the first conductivity type each having a source, a drain and a gate, the gates of the fourth and fifth MOSFETs being respectively connected to the first output node and the second input node, and the source-drain paths of the fourth and fifth MOSFETs being serially connected between the second output node and the drain of the first MOSFET; a sixth MOSFET of a second conductivity type having a source connected to a second potential terminal, a drain and a gate connected to receive a second control signal; seventh and eighth MOSFETs of the second conductivity type each having a source, a drain and a gate, the gates of the seventh and eighth MOSFETs being respectively connected to the first input node and the second output node, and the source-drain paths of the seventh and eighth MOSFETs being serially connected between the first output node and the drain of the sixth MOSFET; ninth and tenth MOSFETs of the second conductivity type each having a source, a drain and a gate, the gates of the ninth and tenth MOSFETs being respectively connected to the second input node and the first output node, and the source-drain paths of the ninth and tenth MOSFETs being serially connected between the second output node and the drain of the sixth MOSFET; and potential setting means connected between the first and second output nodes, for setting the potentials of the first and second output nodes to a preset potential.

According to another aspect of this invention, a sense circuit is provided which comprises first and second input nodes; first and second output nodes; a first MOSFET of a first conductivity type having a drain, a source connected to a first potential terminal and a gate connected to receive a first control signal; second and third MOSFETs of the first conductivity type each having a source, a drain and a gate, the gates of the second and third MOSFETs being respectively connected to the second output node and the first input node, and the source-drain paths of the second and third MOSFETs being serially connected between the first output node and the drain of the first MOSFET; fourth and fifth MOSFETs of the first conductivity type each having a source, a drain and a gate, the gates of the fourth and fifth MOSFETs being respectively connected to the first output node and the second input node, and the source-drain paths of each of the fourth and fifth MOSFETs being serially connected between the second output node and the drain of the first MOSFET; first potential setting means connected between a second potential terminal and the first output node, for setting the first output node to a second potential in response to the control signal; and second potential setting means connected between the second potential terminal and the second output node, for setting the second output node to a second potential in response to the control signal.

According to still another aspect of this invention, a sense circuit is provided which comprises first and second input nodes; first and second output nodes; a first MOSFET of a first conductivity type having a drain, a source connected to a first potential terminal and a gate connected to receive a control signal; second and third MOSFETs of the first conductivity type each having a source, a drain and a gate, the gates of the second and third MOSFETs being respectively connected to the second output node and the first input node, and the source-drain path of the second and third MOSFETs being serially connected between the first output node and the drain of the first MOSFET; fourth and fifth MOSFETs of the first conductivity type each having a source, a drain and a gate, the gates of the fourth and fifth MOSFETs being respectively connected to the first output node and the second input node, and the source-drain path of the fourth and fifth MOSFETs being serially connected between the second output node and the drain of the first MOSFET; a sixth MOSFET of a second conductivity type having a source connected to a second potential terminal, a drain connected to the first output node and a gate connected to the second output node; a seventh MOSFET of the second conductivity type having a source connected to a second potential terminal, a drain connected to the second output node and a gate connected to the first output node; first potential setting means connected between a second potential terminal and the first output node, for setting the first output node to a second potential in response to the control signal; and second potential setting means connected between the second potential terminal and the second output node, for setting the second output node to a second potential in response to the control signal.

Brief Description of the Drawings

FIG. 3 is a circuit diagram of a sense circuit according to one embodiment of this invention;

FIG. 4 is a circuit diagram of a modification of the sense circuit shown in FIG. 3;

FIG. 5 is a circuit diagram of a sense circuit according to another embodiment of this invention;

FIG. 6 is a circuit diagram of a modification of the sense circuit shown in FIG. 5;

FIG. 7 is a circuit diagram of a sense circuit according to a third embodiment of this invention;

FIG. 11 is a circuit diagram of a sense circuit according to a seventh embodiment of this invention;

FIG. 12 is a circuit diagram of a sense circuit according to an eighth embodiment of this invention;

FIG. 13 is a circuit diagram of a sense circuit according to a ninth embodiment of this invention;

FIG. 14 is a circuit diagram of a sense circuit according to a tenth embodiment of this invention;

FIG. 15 is a waveform diagram of signals in the sense circuit of FIG. 3 or 4;

FIG. 16 is a waveform diagram of signals in the sense circuit of FIG. 5 or 6;

FIG. 17 is a waveform diagram of signals in each of the sense circuits of FIGS. 7 to 11;

FIG. 18 is a waveform diagram of signals in the sense circuit of FIG. 11 or 12; and FIG. 19 is a waveform diagram of signals in the sense circuit of FIG. 13 or 14.

DETAILED DESCRIPTION OF THE PREFERRED EMBODIMENTS

Figure 1:
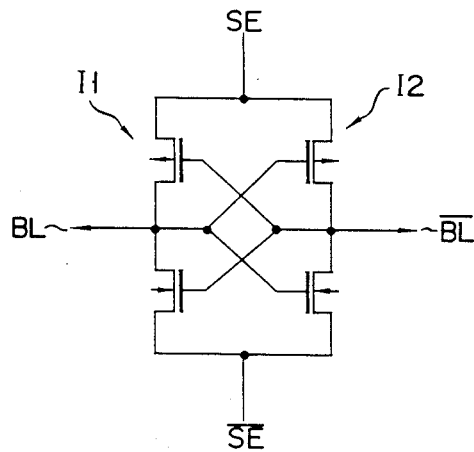
FIG. 1 is a circuit diagram showing one example of the conventional sense circuit.

There will now be described an embodiment of this invention with reference to the accompanying drawings.

FIG. 3 shows the construction of a sense circuit of a first embodiment of this invention. As shown in FIG. 3, the source of N-channel MOSFET N1 is connected to ground potential terminal VSS. Sense circuit activation signal SE is supplied to the gate of MOSFET N1.

The source-drain paths of two N-channel MOSFETs N2 and N3 are serially connected between first output node A at which first output $\overline{OUT}$ is derived and the drain of MOSFET N1. Likewise, the source-drain paths of two N-channel MOSFETs N4 and N5 are serially connected between second output node B at which second output OUT is derived and the drain of MOSFET N1. The gates of MOSFETs N2 and N3 are connected to second output node B and first input node C, respectively, and the gates of MOSFETs N4 and N5 are connected to first output node A and second input node D, respectively.

Further, the source-drain path of precharging P-channel MOSFET P1 is connected between potential terminal VDD of 5 V, for example, which is a positive power source potential terminal and first output node A. Likewise, the source-drain path of precharging P-channel MOSFET P2 is connected between potential terminal VDD and second output node B. Sense circuit activation signal SE is supplied to the gates of MOSFETs P1 and P2.

For example, first input node C and second input node D of the sense circuit are connected to a pair of bit lines BL and $\overline{BL}$ of each column of the memory cell array of a static semiconductor memory of multi-bit configuration.

The operation of the above sense circuit is explained with reference to the waveform diagram of FIG. 15. In the precharging mode, signal SE is set at "L" level to turn on precharging P-channel MOSFETs P1 and P2. As a result, first and second output nodes A and B are precharged to potential VDD or "H" level via precharging MOSFETs P1 and P2. The "H" level set at this time is equal to potential level VDD of 5 V. In the precharged condition, a potential difference is caused between bit lines BL and $\overline{BL}$ according to data read out from a memory cell (not shown). In this example, paired bit lines BL and $\overline{BL}$ are changed from a precharging state in which they are precharged to potentials equal to ½ of power source potential VDD to a state in which one of the bit lines ($\overline{BL}$) is set to "L" level by reading out "L" level data.

When the potential difference between paired bit lines BL and $\overline{BL}$ becomes sufficiently large, signal SE is set to "H" level to turn on MOSFET N1, thus setting the sense circuit into the active state. After the sense circuit is activated, potential $\overline{OUT}$ of first output node A and potential OUT of second output node B start to be lowered according to the potentials of paired bit lines BL and $\overline{BL}$. Since, in this example, the potential of bit line BL is higher than that of bit line $\overline{BL}$, potential $\overline{OUT}$ is lowered more rapidly than potential OUT. As a result, a difference in potential occurs between the gates of MOSFETs N2 and N4 and MOSFET N4 is turned off, interrupting decrease in potential OUT. At this time, potential $\overline{OUT}$ continues to be lowered to potential VSS and is then latched, thus completing the readout operation.

In the above sense circuit, the latching operation does not influence the potentials of the bit lines and therefore the potential variation of the bit lines can be suppressed to a minimum potential difference between the bit lines required for the sense circuit to effect the readout operation. As a result, current necessary for charging and discharging the bit lines can be made extremely small. Since, in SRAMs or EPROMs, a destructive readout operation is effected and it is not always necessary to change the bit line potential over a full range between potentials VDD and VSS, a sense circuit of the above construction can be used. In this case, it is only necessary to change the bit line potential by a potential difference between the bit lines required for the readout operation.

The amplitudes of potentials at output nodes A and B of the above sense circuit are significantly changed. That is, in a case described above, the potential of output node A is changed over a full range between potentials VDD and VSS. However, since only the gate capacitors of MOSFETs constituting a succeeding stage circuit such as a decoder for effecting the column selecting operation are associated with output nodes A and B, the parasitic capacitances thereof are extremely small in comparison with those of input nodes C and D. Therefore, the power consumption caused by current for charging and discharging output nodes A and B by means of precharging MOSFETs P1 and P2 can be suppressed.

Assume that the bit line capacitance is 3 (pF) (this value is obtained in an ordinary SRAM of 256 Kbits or 1 Mbits), the cycle time is 20 (nsec), a potential difference required for the readout operation is 200 (mV), the capacitance of the output node is 0.5 (pF) and power source potential VDD is 5 (V), then current for charging and discharging the bit line is obtained as follows.

$$3 \text{ (pF)} \times 200 \text{ (Mv)} \div 20 \text{ (Nsec)} = 30 \text{ (}\mu\text{A)} \tag{1}$$

That is, even if the potential of the output node is varied over a full range between power source potential VDD and ground potential VSS, the charging and discharging current is obtained as follows.

$$0.5 \text{ (pF)} \times 5 \text{ (V)} \div 20 \text{ (nsec)} = 125 \text{ (}\mu\text{A)} \tag{2}$$

That is, a total current of 155 ($\mu$A) flows in each sense circuit or for each bit to effect the readout operation.

In contrast, when the conventional latch sense circuit shown in FIG. 1 is used, the charging and discharging current can be expressed as follows.

$$3 \text{(pF)} \times 5 \text{ (V)} \div 20 \text{ (nsec)} = 750 \text{ (}\mu\text{A)} \tag{3}$$

Figure 2:
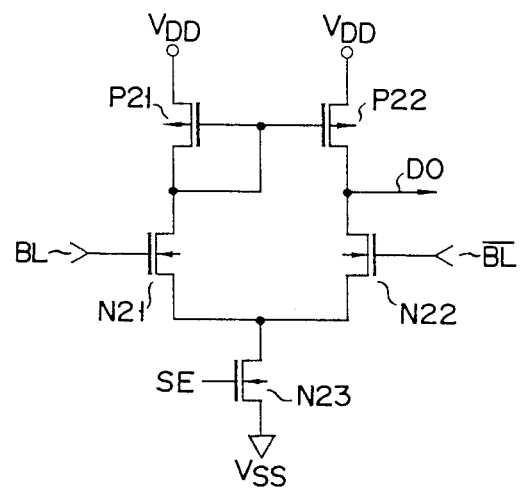
FIG. 2 is a circuit diagram showing another example of the conventional sense circuit.

Thus, the charging and discharging current becomes as large as substantially five times the total current in the above embodiment. Further, when the conventional current mirror type sense circuit of FIG. 2 is used, it is necessary to supply current to the current limiting MOSFET and it is necessary to supply current of at least 300 ($\mu$A) in each sense circuit in order to attain cycle time of 20 (nsec). Therefore, current which is substantially twice the current in the above embodiment is consumed.

FIG. 4 shows the construction of a modification of the embodiment of FIG. 3. The circuit of this modification is similar to the circuit of the embodiment shown in FIG. 3 except that the gate of MOSFET N2 is connected to first input node C instead of being connected to second output node B, the gate of MOSFET N3 is connected to second output node B instead of being connected to first input node C, the gate of MOSFET N4 is connected to second input node D instead of being connected to first output node D, and the gate of MOSFET N5 is connected to first output node A instead of being connected to second input node D. With this construction, the sense circuit operates in the same manner as that of the above embodiment and the same effect can be obtained.

FIG. 5 is a circuit diagram showing the construction of a second embodiment of this invention. The circuit of this embodiment is similar to that of FIG. 3 except that P-channel MOSFETs are used instead of the N-channel MOSFETs of FIG. 3 and power source potential terminal VDD and ground potential terminal VSS are interchanged with each other. That is, the circuit of this embodiment is formed with a complementary construction with respect to that of FIG. 3.

In FIG. 5, the source of P-channel MOSFET P3 is connected to power source potential terminal VDD of 5 V, for example. The gate of MOSFET P3 is supplied with inverted signal $\overline{SE}$ of sense circuit activating signal SE.

The source-drain paths of two P-channel MOSFETs P4 and P5 are serially connected between first output node A at which first output $\overline{OUT}$ is derived and the drain of MOSFET P3. Likewise, the source-drain paths of two P-channel MOSFETs P6 and P7 are serially connected between second output node B at which second output OUT is derived and the drain of MOSFET P3. The gate of MOSFET P4 is connected to second output node B and the gate of MOSFET P5 is connected to first input node C to which one of the paired bit lines or bit line BL is connected. The gate of MOSFET P6 is connected to first output node A and the gate of MOSFET P7 is connected to second input node D to which the other of the paired bit lines or bit line $\overline{BL}$ is connected.

Further, the source-drain path of precharging N-channel MOSFET N6 is connected between ground potential terminal VSS of 0 V and first output node A. Likewise, the source-drain path of precharging N-channel MOSFET N7 is connected between ground potential terminal VSS and second output node B. The gates of MOSFETs N6 and N7 are supplied with inverted signal $\overline{SE}$.

As shown by the waveform diagram in FIG. 16, the sense circuit of this embodiment effects the operation which is complementary to that of the sense circuit of FIG. 3. Therefore, the same effect as in the sense circuit of FIG. 3 can be obtained. That is, in the precharging mode, inverted signal $\overline{SE}$ becomes "H" level to turn on precharging N-channel MOSFETs N6 and N7. As a result, first and second output nodes A and B are precharged to potential VSS or "L" level via precharging MOSFETs N6 and N7. In the precharged condition, a potential difference occurs between paired bit lines BL and $\overline{BL}$ based on data read out from a memory cell (not shown). Also, in this embodiment, paired bit lines BL and $\overline{BL}$ are changed from a precharged state in which they are precharged to potentials equal to ½ of power source potential VDD to a state in which one of the bit lines ($\overline{BL}$) is set to "L" level by reading out "L" level data.

When the potential difference between paired bit lines BL and $\overline{BL}$ becomes sufficiently large, inverted signal $\overline{SE}$ is set to "L" level to turn on MOSFET P3, thus setting the sense circuit into the active state. After the sense circuit is activated, potential OUT rises to potential VDD and potential $\overline{OUT}$ stops rising before reaching potential VDD and is latched, thus completing the readout operation.

FIG. 6 shows the construction of a circuit which is a modification of the circuit in the embodiment of FIG. 5. The circuit of this modification is similar to that of FIG. 5 except that the gate of MOSFET P4 is not connected to second output node B but connected to first input node C, the gate of MOSFET P5 is not connected to first input node C but connected to second output node B, the gate of MOSFET P6 is not connected to first input node A but connected to second input node D and the gate of MOSFET P7 is not connected to second input node D but connected to first output node A. With this construction, the sense circuit operates in the same manner as in the above embodiment and the same effect can be obtained.

FIGS. 7 to 10 are circuit diagrams showing the construction of sense circuits according to other embodiments of this invention. FIG. 7 is a circuit diagram showing the construction of a sense circuit according to a third embodiment of this invention. The circuit of this embodiment is obtained by combining the sense circuits of FIGS. 3 and 5. In this case, instead of precharging P-channel MOSFETs P1 and P2 and N-channel MOSFETs N6 and N7 for setting first output node A and second output node B to the respective initial potential levels, N-channel MOSFET N8 whose source-drain path is connected between first output node A and second output node B is used. The gate of MOSFET N8 is supplied with inverted signal $\overline{SE}$.

Figure 8:
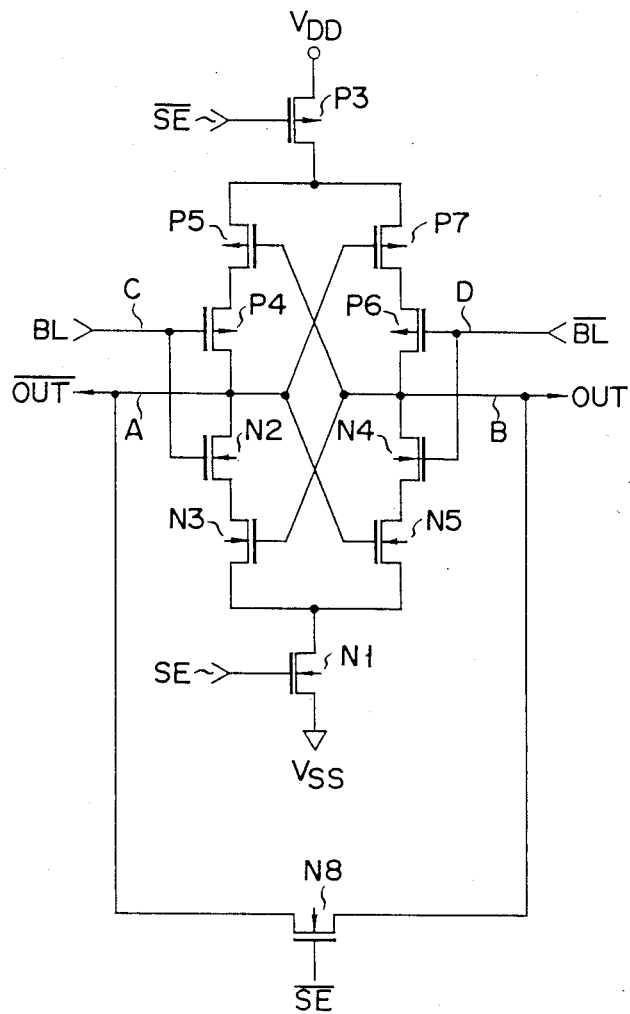
FIG. 8 is a circuit diagram of a sense circuit according to an fourth embodiment of this invention.

FIG. 8 is a circuit diagram showing the construction of a sense circuit according to a fourth embodiment of this invention. The circuit of this embodiment is obtained by combining the sense circuits of FIGS. 4 and 6. Also, in this case, instead of precharging P-channel MOSFETs P1 and P2 and N-channel MOSFETs N6 and N7 for setting first output node A and second output node B to the respective initial potential levels, N-channel MOSFET N8 whose source-drain path is connected between first output node A and second output node B is used. The gate of MOSFET N8 is supplied with inverted signal $\overline{SE}$.

Figure 9:
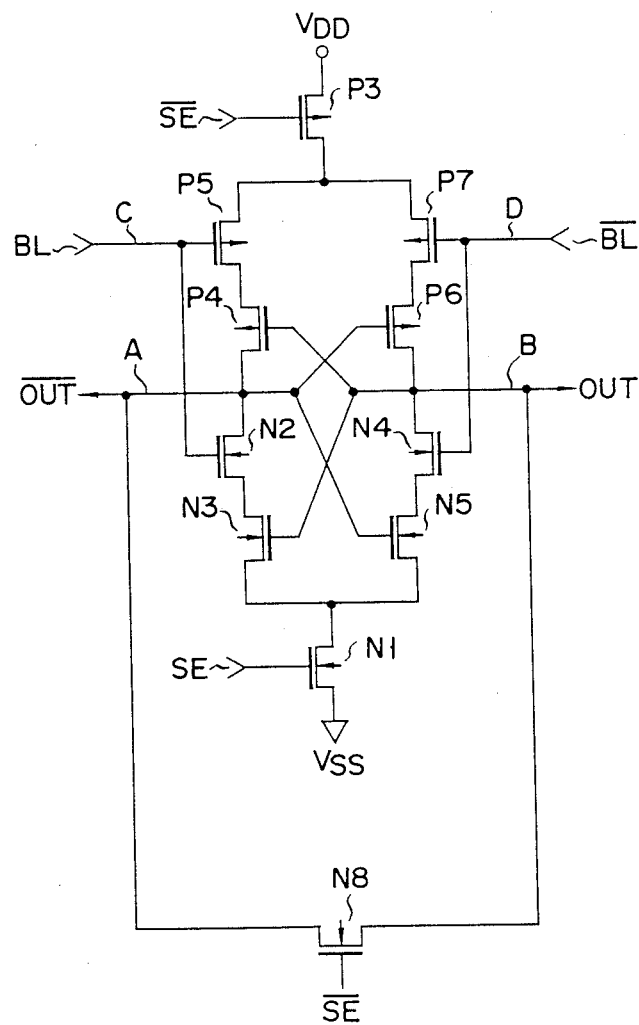
FIG. 9 is a circuit diagram of a sense circuit according to a fifth embodiment of this invention.

FIG. 9 is a circuit diagram showing the construction of a sense circuit according to a fifth embodiment of this invention. The circuit of this embodiment is obtained by combining the sense circuits of FIGS. 4 and 5. Also, in this case, instead of precharging P-channel MOSFETs P1 and P2 and N-channel MOSFETs N6 and N7 for setting first output node A and second output node B to the respective initial potential levels, N-channel MOSFET N8 whose source-drain path is connected between first output node A and second output node B is used. The gate of MOSFET N8 is supplied with inverted signal $\overline{SE}$.

Figure 10:
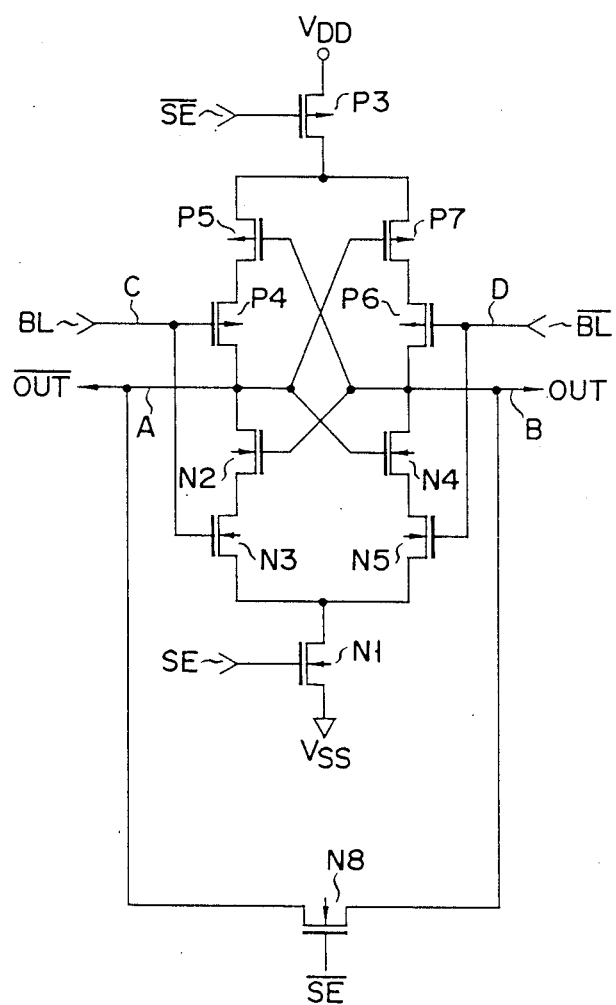
FIG. 10 is a circuit diagram of a sense circuit according to a sixth embodiment of this invention.

FIG. 10 is a circuit diagram showing the construction of a sense circuit according to a sixth embodiment of this invention. The circuit of this embodiment is obtained by combining the sense circuits of FIGS. 3 and 6. Also, in this case, instead of precharging P-channel MOSFETs P1 and P2 and N-channel MOSFETs N6 and N7 for setting first output node A and second output node B to the respective initial potential levels, N-channel MOSFET N8 whose source-drain path is connected between first output node A and second output node B is used. The gate of MOSFET N8 is supplied with inverted signal $\overline{SE}$.

In each of the sense circuits of the embodiments shown in FIGS. 7 to 10, inverted signal $\overline{SE}$ is kept at "H" level before the sense circuit is activated. Therefore, MOSFET N8 is turned on to electrically connect first output node A and second output node B to each other via MOSFET N8. After the preceding readout operation has been completed, one of output nodes A and B is set at "H" level or 5 V of potential VDD and the other output node is set at "L" level or 0 V of potential VSS. Therefore, if first output node A and second output node B are connected to each other via MOSFET N8, a pair of bit lines BL and $\overline{BL}$ are set to a potential equal to ½ of potential VDD. In this condition, a potential difference occurs between paired bit lines BL and $\overline{BL}$ based on data read out from a memory cell (not shown). In this example, "L" level data is read out and bit line $\overline{BL}$ is lowered to "L" level. When a sufficiently large potential difference occurs between paired bit lines BL and $\overline{BL}$, signal SE is set to "H" level and inverted signal $\overline{SE}$ is set to "L" level. As a result, the sense circuit starts the sensing operation to set the potential ($\overline{OUT}$) of first output node A to VSS and set the potential ($\overline{OUT}$) of second output node B to VDD, thus completing the sensing operation. In this embodiment, it is not necessary to respectively set signals SE and $\overline{SE}$ to "H" and "L" levels at exactly the same time.

In each of the embodiments of FIGS. 7 to 10, the potentials of first output node A and second output node B are changed over a full range between power source potential VDD and ground potential VSS. Therefore, after completion of the sensing operation, an intermediate potential will not be applied to the succeeding stage gate circuit so that a D.C. penetration current will not flow between the power source potential terminal and ground potential terminal of the succeeding stage gate circuit, thereby reducing the power consumption. In the sensing operation, both the P-channel MOSFET and N-channel MOSFET are operated to amplify the input. Therefore, the input can be amplified at a higher amplification factor in comparison with the circuits of FIGS. 3 to 6 wherein the input is amplified by only the N-channel MOSFET or only the P-channel MOSFET. As a result, the sensitivity with respect to the input can be enhanced in comparison with the circuits of FIGS. 3 to 6.

FIGS. 11 to 14 are circuit diagrams showing the construction of sense circuits according to still other embodiments of this invention. FIG. 11 is a circuit diagram showing the construction of a sense circuit according to a seventh embodiment of this invention. The circuit of this embodiment is obtained by adding load P-channel MOSFETs P8 and P9 to the sense circuit of FIG. 3. That is, the source, drain and gate of newly added MOSFET P8 are respectively connected to power source potential terminal VDD, first output node A and second output node B. Likewise, the source, drain and gate of newly added MOSFET P9 are respectively connected to power source potential terminal VDD, second output node B and first output node A.

FIG. 12 is a circuit diagram showing the construction of a sense circuit according to an eighth embodiment of this invention. The circuit of this embodiment is obtained by adding two load P-channel MOSFETs P8 and P9 to the sense circuit of FIG. 4 connected in the same manner as in the circuit of FIG. 11.

In the circuits of the above embodiments, as shown by the waveform diagram of FIG. 18, the potential of one of output nodes which is lowered after the start of the sensing operation and stops falling before reaching potential VSS is raised to potential VDD by means of load MOSFET P8 or P9 because load P-channel MOSFETs P8 and P9 are additionally provided. In this example, the potential (OUT) of second output node B is raised to potential VDD. Therefore, in the above two embodiments, the potential of first output node A and the potential of second output node B are changed over a full range between power source potential VDD and ground potential VSS. For this reason, an intermediate potential will not be applied to the succeeding stage gate circuit after the sensing operation and no D.C. penetration current will flow between the power source potential terminal and the ground potential terminal in the succeeding stage gate circuit, thereby more effectively reducing the power consumption. Further, in the sensing operation, the input is amplified by the P-channel MOSFET and N-channel MOSFET. Therefore, the input can be amplified with a higher amplification factor in comparison with the embodiments of FIGS. 3 to 6 in which the input is amplified only by the N-channel MOSFET or only by the P-channel MOSFET, thereby enhancing the sensitivity with respect to the input in comparison with the embodiments of FIGS. 3 to 6.

FIG. 13 is a circuit diagram showing the construction of a sense circuit according to a ninth embodiment of this invention. The circuit of this embodiment is obtained by adding load N-channel MOSFETs N9 and N10 to the sense circuit of FIG. 5. That is, the source, drain and gate of newly added MOSFET N9 are respectively connected to ground potential terminal VSS, first output node A and second output node B. Likewise, the source, drain and gate of newly added MOSFET N10 are respectively connected to ground potential terminal VSS, second output node B and first output node A.

FIG. 14 is a circuit diagram showing the construction of a sense circuit according to a tenth embodiment of this invention. The circuit of this embodiment is obtained by adding two load N-channel MOSFETs N9 and N10 to the sense circuit of FIG. 6 connected in the same manner as in the circuit of FIG. 13.

In the circuits of the above embodiments, as shown by the waveform diagram of FIG. 19, the potential of one of output nodes which is raised after the start of the sensing operation and stops rising before reaching potential VDD is lowered to potential VSS by means of load MOSFET N9 or N10 because load N-channel MOSFETs N9 and N10 are additionally provided. In this example, the potential (OUT) of first output node A is lowered to potential VSS. Therefore, in the above two embodiments, the potential of first output node A and the potential of second output node B are changed over a full range between power source potential VDD and ground potential VSS. For this reason, an intermediate potential will not be applied to the succeeding stage gate circuit after the sensing operation and no D.C. penetration current will flow between the power source potential terminal and the ground potential terminal in the succeeding stage gate circuit, thereby more effectively reducing the power consumption. Further, in the sensing operation, the input is amplified by the P-channel MOSFET and N-channel MOSFET. Therefore, the input can be amplified with a higher amplification factor in comparison with the embodiments of FIGS. 3 to 6 in which the input is amplified only by the N-channel MOSFET or only by the P-channel MOSFET, thereby enhancing the sensitivity with respect to the input in comparison with the embodiments of FIGS. 3 to 6.

Further, since the sense circuit of each of the embodiments of FIGS. 11 to 14 uses a smaller number of MOSFETs than the sense circuit of each of the embodiments of FIGS. 7 to 10, the area occupied by the sense circuit can be made smaller when it is integrated.

What is claimed is:

1. A sense circuit comprising:
   first and second input nodes;
   first and second output nodes;
   a first MOSFET of a first conductivity type having a drain, a source connected to a first potential terminal and a gate connected to receive a control signal;
   second and third MOSFETs of the first conductivity type each having a source, a drain and a gate, the gates of said second and third MOSFETs being respectively connected to said second output node and said first input node, and the source-drain paths of said second and third MOSFETs being serially connected between said /first output node and the drain of said first MOSFET;
   fourth and fifth MOSFETs of the first conductivity type each having a source, a drain and a gate, the gates of said fourth and fifth MOSFETs being respectively connected to said first output node and said second input node, and the source-drain path of said fourth and fifth MOSFETs being serially connected between said second output node and the drain of said first MOSFET;
   first potential setting means connected between a second potential terminal and said first output node, for setting said first output node to a second potential in response to the control signal; and
   second potential setting means connected between said second potential terminal and said second output node, for setting said second output node to a second potential in response to the control signal.

2. A sense circuit according to claim 1, wherein the gates of said second and third MOSFETs are respectively connected to said second output node and first input node, and the gates of said fourth and fifth MOSFETs are respectively connected to said first output node and second input node.

3. A sense circuit according to claim 1, wherein the gates of said second and third MOSFETs are respectively connected to said first input node and second output node, and the gates of said fourth and fifth MOSFETs are respectively connected to said second input node and first output node.

4. A sense circuit according to claim 2, wherein said first potential setting means includes a sixth MOSFET of the second conductivity type having a source connected to said second potential terminal, a drain connected to said first output node and a gate connected to receive the control signal, and said second potential setting means includes a seventh MOSFET of the second conductivity type having a source connected to said second potential terminal, a drain connected to said second output node and a gate connected to receive the control signal.

5. A sense circuit according to claim 3, wherein said first potential setting means includes a sixth MOSFET of the second conductivity type having a source connected to said second potential terminal, a drain connected to said first output node and a gate connected to receive the control signal, and said second potential setting means includes a seventh MOSFET of the second conductivity type having a source connected to said second potential terminal, a drain connected to said second output node and a gate connected to receive the control signal.

6. A sense circuit comprising:
first and second input nodes;
first and second output nodes;
a first MOSFET of a first conductivity type having a drain, a source connected to a first potential terminal and a gate connected to receive a first control signal;
second and third MOSFETs of the first conductivity type each having a source, a drain and a gate, the gates of said second and third MOSFETs being respectively connected to said second output node and said first input node, and the source-drain paths of said second and third MOSFETs being serially connected between said first output node and the drain of said first MOSFET;
fourth and fifth MOSFETs of the first conductivity type each having a source, a drain and a gate, the gates of said fourth and fifth MOSFETs being respectively connected to said first output node and said second input node, and the source-drain paths of said fourth and fifth MOSFETs being serially connected between said second output node and the drain of said first MOSFET;
a sixth MOSFET of a second conductivity type having a source connected to a second potential terminal, a drain and a gate connected to receive a second control signal;
seventh and eighth MOSFETs of the second conductivity type each having a source, a drain and a gate, the gates of said seventh and eighth MOSFETs being respectively connected to said first input node and said second output node, and the source-drain paths of said seventh and eighth MOSFETs being serially connected between said first output node and the drain of said sixth MOSFET;
ninth and tenth MOSFETs of the second conductivity type each having a source, a drain and a gate, the gates of said ninth and tenth MOSFETs being respectively connected to said second input node and said first output node, and the source-drain paths of said ninth and tenth MOSFETs being serially connected between said second output node and the drain of said sixth MOSFET; and
potential setting means connected between said first and second output nodes, for setting the potentials of said first and second output nodes to a preset potential.

7. A sense circuit according to claim 6, wherein the gates of said second, third, fourth and fifth MOSFETs are respectively connected to said second output node, first input node, first output node and second input node; and the gates of said seventh, eighth, ninth and tenth MOSFETs are respectively connected to said second output node, first input node, first output node and second input node.

8. A sense circuit according to claim 7, wherein said potential setting means includes an eleventh MOSFET of the first conductivity type having a source, drain and a gate connected to receive the second control signal, one of the source and drain thereof being connected to said first output node and the other being connected to said second output node.

9. A sense circuit according to claim 6, wherein the gates of said second, third, fourth and fifth MOSFETs are respectively connected to said first input node, second output node, second input node and first output node; and the gates of said seventh, eighth, ninth and tenth MOSFETs are respectively connected to said first input node, second output node, second input node and first output node.

10. A sense circuit according to claim 9, wherein said potential setting means includes an eleventh MOSFET of the first conductivity type having a source, drain and a gate connected to receive the second control signal, one of the source and drain thereof being connected to said first output node and the other being connected to said second output node.

11. A sense circuit according to claim 6, wherein the gates of said second, third, fourth and fifth MOSFETs are respectively connected to said first input node, second output node, second input node and first output node; and the gates of said seventh, eighth, ninth and tenth MOSFETs are respectively connected to said second output node, first input node, first output node and second input node.

12. A sense circuit according to claim 11, wherein said potential setting means includes an eleventh MOSFET of the first conductivity type having a source, drain and a gate connected to receive the second control signal, one of the source and drain thereof being connected to said first output node and the other being connected to said second output node.

13. A sense circuit according to claim 6, wherein the gates of said second, third, fourth and fifth MOSFETs are respectively connected to said second output node, first input node, first output node and second input node; and the gates of said seventh, eighth, ninth and tenth MOSFETs are respectively connected to said first input node, second output node, second input node and first output node.

14. A sense circuit according to claim 13, wherein said potential setting means includes an eleventh MOSFET of the first conductivity type having a source, drain and a gate connected to receive the second control signal, one of the source and drain thereof being connected to said first output node and the other being connected to said second output node.

15. A sense circuit comprising:
first and second input nodes;
first and second output nodes;
a first MOSFET of a first conductivity type having a drain, a source connected to a first potential terminal and a gate connected to receive a control signal;
second and third MOSFETs of the first conductivity type each having a source, a drain and a gate, the gates of said second and third MOSFETs being respectively connected to said second output node and said first input node, and the source-drain paths of said second and third MOSFETs being serially connected between said first output node and the drain of said first MOSFET;
fourth and fifth MOSFETs of the first conductivity type each having a source, a drain and a gate, the gates of said fourth and fifth MOSFETs being respectively connected to said first output node and said second input node, and the source-drain paths of said fourth and fifth MOSFETs being serially connected between said second output node and the drain of said first MOSFET;
a first load circuit connected between a second potential terminal and said second output node;
a second load circuit connected between said second potential terminal and said second output node;
first potential setting means connected between said second potential terminal and said first output node, for setting said first output node to a second potential in response to the control signal; and
second potential setting means connected between said second potential terminal and said second output node, for setting said second output node to the second potential in response to the control signal.

16. A sense circuit according to claim 15, wherein the gates of said second and third MOSFETs are respectively connected to said second output node and first input node, and the gates of said fourth and fifth MOSFETs are respectively connected to said first output node and second input node.

17. A sense circuit according to claim 15, wherein the gates of said second and third MOSFETs are respectively connected to said first input node and second output node, and the gates of said fourth and fifth MOSFETs are respectively connected to said second input node and first output node.

18. A sense circuit according to claim 15, wherein said first load circuit includes a sixth MOSFET of the second conductivity type having a source connected to said second potential terminal, a drain connected to said first output node and a gate connected to said second output node; and said second load circuit includes a seventh MOSFET of the second conductivity type having a source connected to said second potential terminal, a drain connected to said second output node and a gate connected to said first output node.

19. A sense circuit according to claim 15, wherein said first load circuit includes a sixth MOSFET of the second conductivity type having a source connected to said second potential terminal, a drain connected to said first output node and a gate connected to said second output node; and said second load circuit includes a seventh MOSFET of the second conductivity type having a source connected to said second potential terminal, a drain connected to said second output node and a gate connected to said first output node.

* * * * *

UNITED STATES PATENT AND TRADEMARK OFFICE
CERTIFICATE OF CORRECTION

PATENT NO. : 4,973,864
DATED : November 27, 1990
INVENTOR(S) : Kazutaka Nogami It is certified that error appears in the above-identified patent and that said Letters Patent is hereby corrected as shown below:

Column 10, Claim 1, Line 48, change "/first" to --first--.

Signed and Sealed this

Seventeenth Day of March, 1992

*Attest:*

HARRY F. MANBECK, JR.

*Attesting Officer*      *Commissioner of Patents and Trademarks*